US012072632B2

(12) United States Patent
Laforge et al.

(10) Patent No.: US 12,072,632 B2
(45) Date of Patent: Aug. 27, 2024

(54) METHOD FOR FABRICATING A METAL DECORATION ON A DIAL AND DIAL OBTAINED BY THIS METHOD

(71) Applicant: The Swatch Group Research and Development Ltd, Marin (CH)

(72) Inventors: Elias Laforge, Neuchatel (CH); Alexandre Haemmerli, Neuchatel (CH); Benjamin Tixier, Neuchatel (CH); Pascal Grossenbacher, Neuchatel (CH); Pierry Vuille, Les Emibois (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days.

(21) Appl. No.: 16/271,912

(22) Filed: Feb. 11, 2019

(65) Prior Publication Data
US 2019/0278182 A1    Sep. 12, 2019

(30) Foreign Application Priority Data
Mar. 9, 2018 (EP) ..................................... 18161026

(51) Int. Cl.
*G03F 7/20* (2006.01)
*B44C 1/00* (2006.01)
(Continued)

(52) U.S. Cl.
CPC .................. *G03F 7/20* (2013.01); *B44C 1/00* (2013.01); *C25D 7/005* (2013.01); *G03F 7/16* (2013.01);
(Continued)

(58) Field of Classification Search
CPC . G03F 7/20; G03F 7/16; G03F 7/0037; G03F 7/18; B44C 1/00; C25D 7/005;
(Continued)

(56) References Cited

U.S. PATENT DOCUMENTS 6,781,086 B2 * 8/2004 Choi ................. H01L 21/31138
219/121.43
7,628,894 B2 * 12/2009 Grippo ..................... B44C 3/02
204/192.12
(Continued)

FOREIGN PATENT DOCUMENTS

CH      704 955 B1    11/2012
CN      1432662       7/2003
(Continued)

OTHER PUBLICATIONS

European Search Report issued on Aug. 29, 2018 in European Application 18161026.2 filed on Mar. 9, 2018 (with English Translation of Categories of Cited Documents).
(Continued)

*Primary Examiner* — Duy Vu N Deo
*Assistant Examiner* — Christopher Remavege
(74) *Attorney, Agent, or Firm* — Oblon, McClelland, Maier & Neustadt, L.L.P.

(57) ABSTRACT

A method for fabricating metal decorations on a domed dial made of insulating material, wherein the method includes the steps of forming a photosensitive resin mould by a UV LIGA type process, and electrodepositing a layer of at least one metal starting from the conductive layer to form a block, which substantially reaches the upper surface of the photosensitive resin.

17 Claims, 2 Drawing Sheets

(51) Int. Cl.
  *C23F 1/02* (2006.01)
  *C25D 5/02* (2006.01)
  *C25D 7/00* (2006.01)
  *G03F 7/16* (2006.01)
  *G04B 37/22* (2006.01)
(52) U.S. Cl.
  CPC ............... *G04B 37/22* (2013.01); *C23F 1/02* (2013.01); *C25D 5/022* (2013.01)
(58) Field of Classification Search
  CPC .......... C25D 5/022; C25D 1/003; C25D 5/10; G04B 37/22; G04B 19/10; G04B 19/12; G04B 45/0069; C23F 1/02; G04D 3/0069
  See application file for complete search history.

(56) References Cited

U.S. PATENT DOCUMENTS

| | | | | |
|---|---|---|---|---|
| 2003/0224201 | A1* | 12/2003 | Kawakami | C23C 14/0015 428/672 |
| 2011/0259753 | A1 | 10/2011 | Grossenbacher et al. | |
| 2012/0042510 | A1* | 2/2012 | Fussinger | G03F 7/0035 29/829 |
| 2016/0176228 | A1* | 6/2016 | Dubach | B22D 23/06 428/156 |

FOREIGN PATENT DOCUMENTS

| | | |
|---|---|---|
| CN | 101918617 | 12/2010 |
| CN | 105708061 | 6/2016 |
| EP | 2 380 864 A1 | 10/2011 |
| JP | 2004-327616 | 11/2004 |
| JP | 2010-101712 * | 5/2010 |
| WO | WO2009/083488 | 7/2009 |

OTHER PUBLICATIONS

Park, J. et al. "Fabrication of metallic microstructure on curved substrate by optical soft lithography and copper electroplating", Sensors and Actuators A: Physical vol. 168 No. 1, 2011, pp. 105-111.

Jackman, R. et al. "Three-Dimensional Metallic Microstructures Fabricated by Soft Lithography and Microelectrodeposition", Langmuir vol. 15 No. 3, 1999, pp. 826-836.

Office Action in corresponding Chinese Application No. 20191050206.5 dated Jul. 15, 2020. (w/English Translation).

Office Action in corresponding Chinese Patent Application No. 2019101502065 dated Jan. 15, 2021. (w/English Translation).

* cited by examiner

METHOD FOR FABRICATING A METAL DECORATION ON A DIAL AND DIAL OBTAINED BY THIS METHOD

CROSS-REFERENCE TO RELATED APPLICATION

This application claims priority to European Patent Application No. 18161026.2 filed on Mar. 9, 2018, the entire disclosure of which is hereby incorporated herein by reference.

FIELD OF THE INVENTION

The present invention concerns a method for fabricating a metal decoration via a LIGA type technology. In particular, the invention concerns a method of this type for fabricating a domed ceramic dial with a metal decoration that fits optimally onto the dial. The invention also concerns a dial of this type obtained by this method.

BACKGROUND OF THE INVENTION

LIGA technology (Lithographie Galvanik Abformung) developed by W. Ehrfeld of the Karlsruhe Nuclear Research Centre, Germany in the 1980s, has proved advantageous for fabricating high precision metal microstructures.

The principle of the LIGA technique consists in depositing a photosensitive resin layer on a conductive substrate or a substrate coated with a conductive layer, in X irradiating through a mask corresponding to the contour of the desired microstructure using a synchrotron, in developing, i.e. removing by physical or chemical means the non-irradiated portions of the photosensitive resin layer in order to produce a mould having the contour of the microstructure, in electrodepositing a metal, typically nickel, in the photosensitive resin mould, and then in removing the mould to release the microstructure.

The quality of the microstructures obtained is not open to criticism, but the requirement to implement expensive equipment (the synchrotron) makes this technique incompatible with the mass production of microstructures that must have a low unit cost.

This is why similar methods, based on the LIGA method but using UV photosensitive resins, have been developed. This method is described in particular in CH Patent No. 704955, and includes the following steps:
- providing a substrate having at least one conductive surface;
- applying a photosensitive resin layer to the conductive surface of the substrate;
- irradiating the resin layer through a mask defining the contour of the desired microstructure;
- dissolving the non-irradiated areas of the photosensitive resin layer to reveal, in places, the conductive surface of the substrate;
- electrodepositing alternate layers of a first metal and of at least a second metal, starting from said conductive surface, to form a unit that substantially reaches the upper surface of the photosensitive resin, said unit being formed of a stack of layers of the first and second metals;
- separating the resin layer and the electrodeposited unit from the substrate by delamination, and
- removing the photosensitive resin layer from the delaminated structure to release the microstructure thereby formed.

The production of metal decorations by electrodeposition according to this prior art method is carried out on a flat surface and the implementation thereof on a part having a domed surface is much more complex, since the curvature of the part prevents the decorations being properly mounted.

SUMMARY OF THE INVENTION

It is an object of the present invention to overcome the aforementioned drawbacks in addition to others by providing a method for fabricating metal decorations conforming to the curvature of the parts to be decorated.

It is another object of the present invention to provide a method of this type, which is simple and inexpensive to implement.

To this end, the invention concerns a method for fabricating at least one metal decoration on a substrate made of insulating material having a curved surface that includes the following steps:
a) providing a non-conductive substrate, for example made of ceramic material, having a domed surface, depositing at least a first adhesion layer, and a second electrically conductive layer, via a PVD method or similar;
b) depositing a third adhesion layer via a PVD process or similar;
c) applying a photosensitive resin layer;
d) irradiating the resin layer through a mask defining the geometry of the desired decorations;
e) dissolving the non-irradiated areas of the photosensitive resin layer to reveal the third adhesion layer where the decorations are located;
f) removing the third adhesion layer where the decorations are located to reveal the second electrically conductive layer;
g) electrodepositing a metal layer, starting from said conductive surface, to form a unit that substantially reaches the upper surface of the photosensitive resin;
h) removing the remaining resin layer by plasma etching;
i) removing the first, second and third layers by wet etching.

This method thus makes it possible to make finished ceramic parts having a domed surface with metal decorations in relief that perfectly fit the surface.

According to other advantageous variants of the invention:
- said first adhesion layer is of the Ti, Ta, Cr or Th type;
- said second electrically conductive layer is of the Au, Pt, Ag, Cr, Pd, TiN, CrN, ZrN, Ni type;
- said third adhesion layer is of the $SiO_2$, $TiO_2$, AlN or $Si_xN_y$ type;
- the first adhesion layer has a thickness comprised between 30 nm and 80 nm;
- the second conductive layer has a thickness comprised between 30 nm and 80 nm;
- the third adhesion layer has a thickness of at least 10 nm,
- according to a variant of the method, during step g), a first metal is deposited up to the top of the mould, and before step i), the method includes a step h') of depositing a second metal covering the first deposited metal;
- the substrate made of insulating material is a non-electrically conductive substrate, made from ceramic, sapphire, mother of pearl, glass, quartz, diamond, mineral material (granite, marble . . . ), polymers, composites or enamel.

Finally, the invention relates to a domed dial made of insulating material having metal decorations, intended to be placed on a watch case, and obtained by a method according to the invention, the decorations being hour symbols, appliques and/or a logo.

It is clear that the method of the invention is of particularly advantageous application for fabricating decorative parts for timepieces.

BRIEF DESCRIPTION OF THE DRAWINGS

Other features and advantages of the present invention will appear more clearly from the following detailed description of an example embodiment of a method according to the invention, this example being given purely by way of non-limiting illustration in conjunction with the annexed drawing, in which.

DETAILED DESCRIPTION OF PREFERRED EMBODIMENTS

Figure 1A:
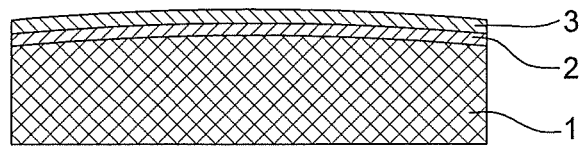
FIGS. 1a to 1i illustrate the method steps of an embodiment of the invention in order to make a dial provided with appliques.
Figure 1B:
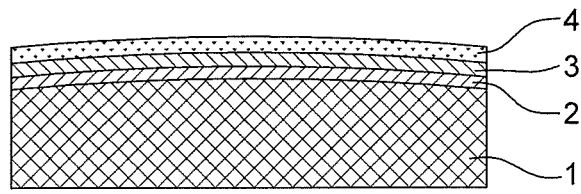
Figure 1C:
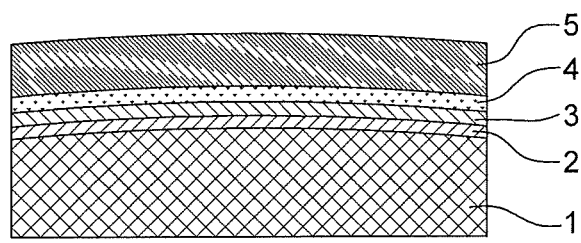

The substrate 1 used in step a) of the method according to the invention is, for example, formed by a substrate made of ceramic, sapphire, enamel or otherwise, and having a domed surface. In the first step a) of the method, there is deposited, for example, by physical vapour deposition (PVD), a first adhesion layer 2 and a second conductive layer 3, i.e. a layer capable of starting a metal electrodeposition. Typically, adhesion layer 2 is of the Ti, Ta, Cr or Th type, and has a thickness comprised between 30 nm and 80 nm, and conductive layer 3 is of the Au, Pt, Ag, Cr, Pd, TiN, CrN, ZrN, Ni type (FIG. 1a) and also has a thickness comprised between 30 nm and 80 nm. The first and second adhesion layers can be deposited by any other means known to those skilled in the art.

Alternatively, the substrate may be made of stainless steel or another metal able to start an electroforming reaction. In such case, the first and second layers are no longer necessary. In the case of a stainless steel substrate, the substrate will be cleaned before use, and the back will be protected with varnish or resin to prevent electrodeposition on this back surface.

In step b), a third adhesion layer 4 is deposited, for example by physical vapour deposition with magnetron cathode sputtering, onto the second conductive layer 3. Adhesion layer 4 is, for example, of the SiO2, TiO2, AlN or SixNy type, par example, SiN or Si3N4, and has a thickness of at least 10 nm.

This adhesion layer 4 has the advantage of allowing optimum adherence of the resin for the next step of the method. This third adhesion layer 4 also makes it possible to form a protective layer on the second conductive layer in case of detachment of the resin, which avoids undesired galvanic growth during the subsequent method steps.

The photosensitive resin 5 used in step c) of the method according to the invention is preferably a negative, octa-functional, epoxy-based resin available from Microchem under the reference SU-8 and a photoinitiator selected from triarylsulfonium salts, such as those described in U.S. Pat. No. 4,058,401. This resin is susceptible to photopolymerization under the action of UV radiation. It will be noted that a solvent that has proved suitable for this resin is gamma butyrolactone (GBL).

Alternatively, a Novolac-type, phenol formaldehyde-based resin, in the presence of a DNQ (diazonaphthoquinone) photoinitiator, can also be used.

Resin 5 is deposited on substrate 1 by any suitable means, by centrifugal coating, with a spin coater, or by spraying until the desired thickness is obtained. Typically, the thickness of the resin is comprised between 1 μm and 500 μm, and more preferably between 20 μm and 300 μm. Depending on the desired thickness and the deposition technique used, resin 5 will be deposited in one or more steps.

Resin 5 is then heated between 80 and 95° for a period of time that depends on the deposited thickness, to remove the solvent. The heating dries and hardens the resin.

Figure 1D:
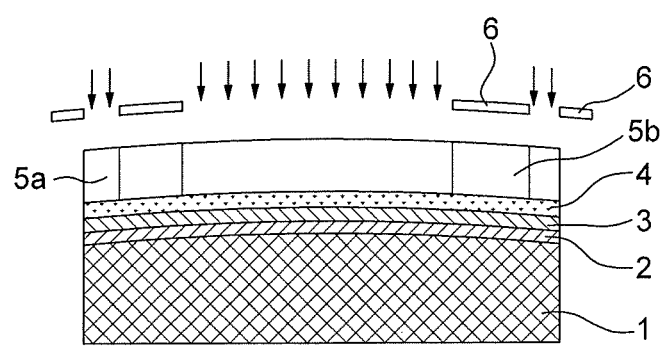

The next step d) illustrated in FIG. 1d consists in irradiating resin layer 5 by UV radiation through a mask 6 defining the contour of the desired decorations and thus of photopolymerized areas 5a and of non-photopolymerized areas 5b. Typically, this UV irradiation is from 200 to 1,000 mJ·cm-2, measured at a typical wavelength of 365 nm, and depends upon the thickness of the layer and the type of resin selected.

Where necessary, a step of annealing resin layer 5 may be required to complete the photopolymerization induced by UV irradiation. This annealing step is preferably performed between 90° C. and 95° C. for 15 to 30 minutes. The photopolymerized areas 5a become insensitive to the vast majority of solvents. However, the non-photopolymerized areas could subsequently be dissolved by a solvent.

Figure 1E:
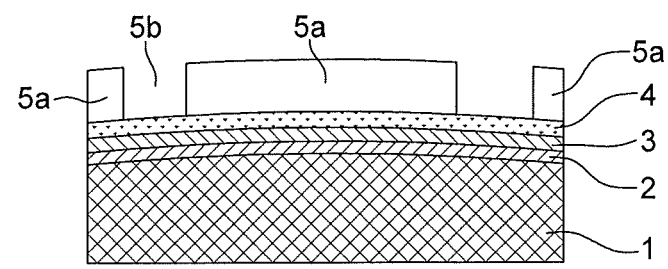

The next step e), illustrated in FIG. 1e, consists in removing the non-photo polymerized areas 5b of the photosensitive resin layer to reveal, in places, adhesion layer 4 of substrate 1. This operation is performed by dissolving non-photopolymerized areas 5b using a suitable solvent, for example selected from among GBL (gamma butyrolactone) and PGMEA (propylene glycol methyl ether acetate). A photopolymerized photosensitive resin mould 5a having the contours of a decoration is thus created.

Figure 1F:
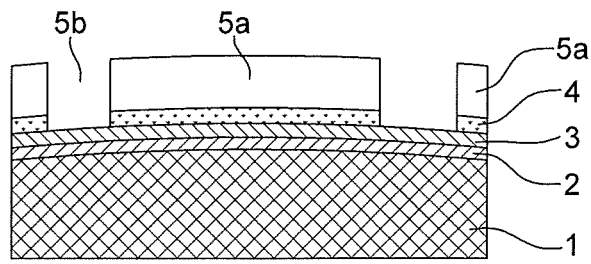

The next step f) illustrated in FIG. 1f consists in removing third adhesion layer 4 from the mould formed to reveal second conductive layer 3. Typically, third adhesion layer 4 is removed by means of plasma etching or by reactive ion etching (RIE).

Figure 1G:
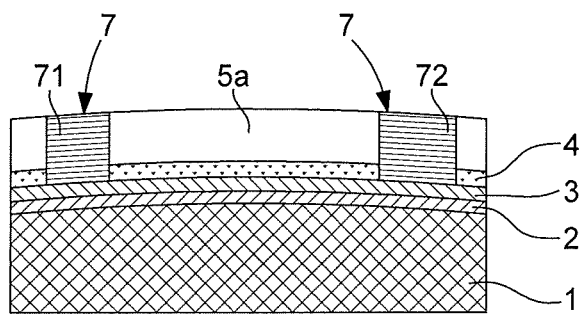

The next step g), illustrated in FIG. 1g, consists in electrodepositing a metal layer in the moulds, starting from said conductive layer 3, to form a plurality of units 71, 72 that preferably reach the top of the moulds, the thickness of the metal layer being comprised between 1 μm and 500 μm, and more preferably between 20 μm and 300 μm. In this context, 'metal' of course includes metal alloys. Typically, the metal will be selected from among the group including nickel, copper, gold or silver, and, as alloys, copper-gold, nickel-cobalt, nickel-iron, nickel-phosphorus or nickel-tungsten.

The electroforming conditions, in particular the composition of the baths, system geometry, current densities and voltages, are selected for each metal or alloy to be electrodeposited in accordance with techniques that are well known in the art of electroforming, (cf. for example Di Bari G. A. "electroforming" Electroplating Engineering Handbook 4th Edition edited by L. J. Durney, published by Van Nostrand Reinhold Company Inc., N.Y. USA 1984).

Figure 1H:
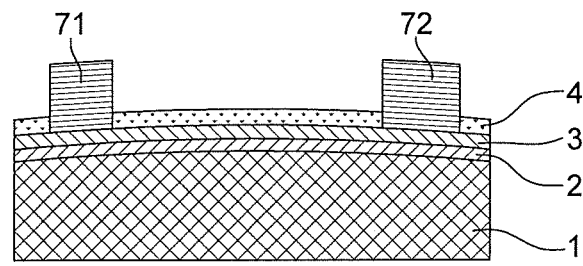
Figure 1H:
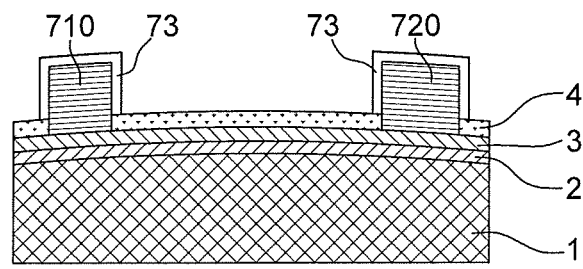

The next step h) illustrated in FIG. 1h consists in removing resin layer 5a from electrodeposited units 71, 72 and from substrate 1 by means of plasma etching, which makes it possible to remove the resin without damaging electrodeposited units 71, 72.

At the end of this step h), a substrate 1 is obtained with electrodeposited units 71, 72 forming a decoration on substrate 1, since the first, second and third layers 2, 3, 4 are still present in places on the substrate once the remaining resin is removed.

Figure 1I:
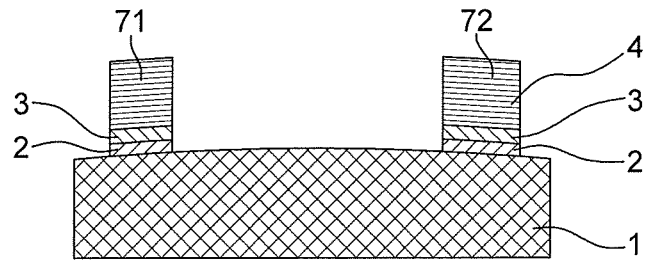

In step i) illustrated in FIG. 1i, the first, second and third layers 2, 3, 4 are removed by means of at least one wet etch. For example, the SiO2 and TiO2 layers are etched with hydrofluoric acid or BOE (buffered oxide etchant). The Au layer is etched with aqua regia (nitric acid+hydrochloric acid) or KI (potassium iodide) or KCN (potassium cyanide). The nickel is etched with nitric acid.

At the end of this step, the parts obtained can be cleaned, and possibly reworked on a machine-tool to perform machining operations or for an aesthetic finish. At this stage, the parts can be used immediately or subjected to various decorative and/or functional treatments, typically physical or chemical depositions.

According to an alternative of the invention, in step g), a layer of a first metal, such as for example, nickel, is electrodeposited starting from said conductive layer to form a unit 710, 720 with a height lower than or equal to the height of the resin. The next step h) remains the same, and an additional step h') is performed during which a layer 73 of another metal or alloy is electrodeposited, for example a precious metal such as gold, on top of the layer of first metal. Finally, in step i) adhesion layer 4 and conductive layer 3 and adhesion layer 2 are removed by at least one wet etch.

Such an alternative is less expensive and easier to implement, since nickel growth is easier to control and less expensive than a precious metal such as gold.

The method of the invention is of particularly advantageous application for fabricating decorative parts for timepieces, and more particularly for domed dials made of non-conductive material having metal decorations on its surface. The decorations may be hour symbols, appliques, logos or brand names, for example. Through this method, a domed dial made of non-conductive material can be provided with any type of metal decoration that perfectly fits the surface curvature of the domed dial, with very precise positioning, and in a multi-part and therefore economically advantageous process.

The invention claimed is:

1. A method for fabricating at least one metal decoration on a substrate made of insulating material having a domed surface, the method comprising:
    (a) depositing onto a ceramic, sapphire, mother of pearl, glass, quartz, diamond, mineral material, polymer, composite, or enamel substrate a first adhesion layer, comprising Ti, Ta, Cr, or Th, then, onto the first adhesion layer, a second electrically conductive layer, comprising Au, Pt, Ag, Cr, Pd, TiN, CrN, ZrN, or Ni, by vapor phase deposition;
    (b) depositing a third adhesion layer, comprising $Si_xN_y$, onto the second electrically conductive layer;
    (c) applying a photosensitive resin layer on the third adhesion layer;
    (d) irradiating the resin layer through a mask defining a contour of desired decoration(s);
    (e) dissolving non-irradiated areas of the photosensitive resin layer to reveal, in places, the third adhesion layer where the decoration(s) are located;
    (f) removing the third adhesion layer where the decoration(s) are located, to reveal the second conductive layer;
    (g) electrodepositing a first metal or metal alloy, starting from the second electrically conductive surface, to form at least one unit that substantially reaches an upper surface of the photosensitive resin;
    (h) plasma etching to thereby remove the remaining resin layer; and
    (i) wet etching to thereby remove the first adhesion layer, second electrically conductive layer, and third adhesion layer.

2. The method of claim 1, wherein the first adhesion layer comprises Ti.

3. The method of claim 1, wherein the second electrically conductive layer comprises Au, Pt, Ag, Cr, or Pd.

4. The method of claim 1, wherein the first adhesion layer has a thickness in a range of from 30 to 80 nm.

5. The method of claim 1, wherein the second conductive layer has a thickness in a range of from 30 to 80 nm.

6. The method of claim 1, wherein the third adhesion layer has a thickness of at least 10 nm.

7. The method of claim 1, further comprising:
    before the wet etching (i), (h') of depositing a second metal or metal alloy covering the first deposited metal or metal alloy,
    wherein, during the electrodepositing (g), a first metal or metal alloy is deposited up to the top of a mold.

8. The method of claim 1, wherein the substrate is made of ceramic, sapphire, or enamel.

9. The method of claim 1, wherein the substrate is made of the sapphire.

10. The method of claim 1, wherein the second electrically conductive layer comprises TlN, CrN, ZrN, or Ni.

11. The method of claim 1, wherein the third adhesion layer consists of $Si_xN_y$.

12. The method of claim 1, wherein the first adhesion layer comprises Ta.

13. The method of claim 1, wherein the first adhesion layer comprises Cr.

14. The method of claim 1, wherein the first adhesion layer comprises Th.

15. The method of claim 1, wherein the first adhesion layer has a thickness in a range of from 30 to 80 nm, and
    wherein the second conductive layer has a thickness in a range of from 30 to 80 nm.

16. The method of claim 1, wherein the first adhesion layer has a thickness in a range of from 30 to 80 nm,
    wherein the second conductive layer has a thickness in a range of from 30 to 80 nm, and
    wherein the third adhesion layer has a thickness of at least 10 nm.

17. The method of claim 1, wherein the irradiating further comprises an annealing performed in a range of from 90 to 95° C. for a time in a range of from 15 to 30 minutes.

* * * * *